United States Patent [19]

Kirshenboin et al.

[11] 4,327,860

[45] May 4, 1982

[54] METHOD OF MAKING SLACK FREE WIRE INTERCONNECTIONS

[75] Inventors: Zeev Kirshenboin, Horsham; Mark B. Soffa, Wynnewood, both of Pa.

[73] Assignee: Kulicke and Soffa Ind. Inc., Horsham, Pa.

[21] Appl. No.: 109,211

[22] Filed: Jan. 3, 1980

[51] Int. Cl.³ .................... B23K 31/02; H01L 21/90; H05K 3/34
[52] U.S. Cl. .................................... 228/179; 228/4.5
[58] Field of Search ............................... 228/4.5, 179

[56] References Cited

U.S. PATENT DOCUMENTS 3,641,660 2/1972 Adams et al. ..................... 228/179
4,213,556 7/1980 Persson et al. .................. 228/4.5 X Primary Examiner—Robert D. Baldwin
Attorney, Agent, or Firm—John B. Sowell

[57] ABSTRACT

Electrodes and lead-out terminals of semiconductor devices employ fine wire interconnections which require forming into a predetermined configuration. The method of the present invention provides several novel steps in a sequence of steps which causes the interconnection wire to be shaped in an extremely desirable configuration free of slack. The method is characterized by first preforming a portion of the wire in a direction opposite the direction of the desired interconnection and subsequently reforming the preformed portion of wire while the remainder of the interconnection wire is being formed in tension.

24 Claims, 17 Drawing Figures

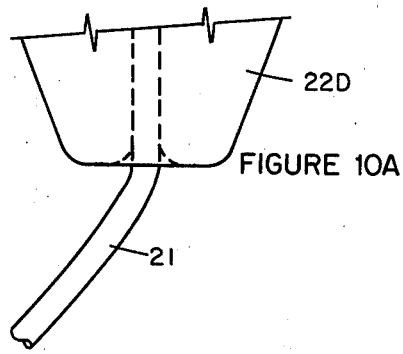
FIGURE 10A
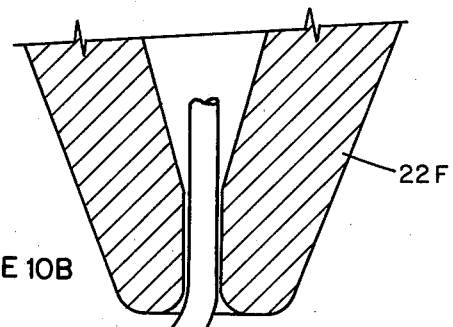
FIGURE 10B
FIGURE 10
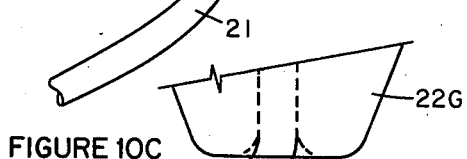
FIGURE 10C
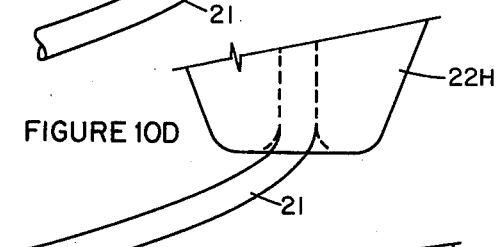
FIGURE 10D
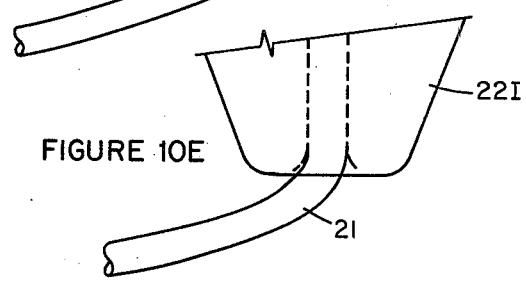
FIGURE 10E
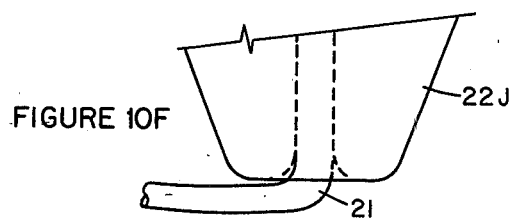
FIGURE 10F

METHOD OF MAKING SLACK FREE WIRE INTERCONNECTIONS

BACKGROUND OF THE INVENTION

Field of the Invention

The present invention is related to fine wire bonding and the operation of fine wire bonding machines employed in the manufacture of semiconductor devices. More particularly, the present invention is related to a novel method of forming fine wire interconnection between terminals on an integrated circuit and the lead out pads on a substrate or package.

Fine wire bonding machines have been employed to connect wire smaller than an average human hair between electrodes and terminals of semiconductor devices. There are numerous discrete semiconductor devices and integrated circuits where the shape of the interconnecting wire need not conform to an exact predetermined shape and height. As a general rule, if the interconnecting wires are being made between points which are below sixty one thousandths of an inch (60 mils) apart and the wires are not close to each other the interconnections could tolerate variations in loop height, bends in the interconnection wire and slack in the interconnection wire.

Manually operated wire bonding machines such are those described in U.S. Pat. Nos. 3,543,988 and 3,643,321 teach apparatus designed to make fine wire interconnections. These and other prior art wire bonding machines were provided with means for adjusting the height the bonding tool is raised after making a first bond in order to provide a loop in the interconnecting wire. Most of the prior art bonding machines raised the bonding tool an excessive amount causing a great excess of wire to be pulled out of the bonding tool. This great excess of wire caused irregular loops to be formed. The loops could be too high or too low. The loop could sag and touch at intermediate points. The loops could bend sideways or bow and touch adjacent wires.

Automatic bonding machines such as Model 1418/1419 made by Kulicke and Soffa Industries, Inc. of Horsham, Pa. are provided with microprocessor controls which enable the path of the bonding to be controlled precisely. Even though automatic wire bonders have been commerically available for several years, heretofore it has been impossible to make repeatable slack free interconnection between conductive pads. Further, automatic wire bonders are operated at speeds where four interconnection wires are made in one second. It is impossible to visually inspect each interconnection wire and to exert some manual input to perfect the form of the interconnection wires.

Prior art automatic wire bonders are programmable to enable the bonding tool to be moved in virtually any predeterminable path. Numerous paths have been tried for many years, however, the paths employed heretofore did not result in repeatable slack free interconnecting wires. When the distance between bonding points on conductive pads exceeded eighty one thousandths of an inch it was virtually impossible to control the shape of the interconnection wires.

Some of the causes of inconsistent interconnection wires are known. For example, a bend or a bow in an interconnecting wire can be caused by excessive wire in the interconnection. Excessive wire can be caused by wire which is work harden by rubbing on a tool or by taking the shape of a wire spool on which the wire is wound such that the bow or bend is inherently in the wire and is not removed during the bonding operation which forms the interconnection. When an excessive length of wire is paid out of a capillary bonding tool and the bonding tool is moved relative to the wire to reduce the exposed length of wire, the bonding tool is capable of frictional engagement with the wire to bend or bow the wire thus leaving different lengths or wire exposed for making the interconnection.

It has been suggested that the desired length of wire for making the interconnection be paid out of a capillary bonding tool and the wire clamped relative to the bonding tool and then moving the bonding tool to the second conductive pad to make the second bond. This method of bonding assures the correct length of wire for each interconnection but has not been able to produce consistently form loops free of slack, bends, bows or distortion.

Large integrated circuits have introduced a new problem which affects the consistency of interconnection wires. As the number of connection points on the perimeter of the integrated circuit chips has increased, the number of outer leads or outer connection points has increased. To prevent crowding the outer leads they have been moved further away from the pads or connection points on the integrated circuit chips. For example, a square or rectangular chip is surrounded by an array of outer leads three to five mils wide and separated from each other by three to five mils. The array of outer leads in usually arranged in the same square or rectangular pattern which is larger than the chips. Accordingly, there is only one pad at the center of each side of the chip which is axially aligned with the outer lead or finger. The distance of the other interconnection is also greater than the interconnection which is axially aligned. The interconnection wire which connects the conductive pad at the corner of the chip to the finger or lead in the corner of the array of outer leads not only is the longest, but crosses over the outer lead at an angle. When the bonding tool is attempting to make a second bond on this corner outer lead a portion of the wire touches the side of the outer lead finger which exerts a side force great enough to move the wire before a bond can be made. When such side forces are present interconnection wires have been distorted and produce unacceptable devices. While the problem has existed for many years, only recently have the dimension become so critical that unacceptable interconnection wires could not be produced using manual or automatic wire bonders.

SUMMARY OF THE INVENTION

It is a principal object of the present invention to provide a novel method of making and forming fine wire interconnections between conductive pads or points on semiconductor devices.

It is another principal object of the present invention to provide a method of making and forming fine wire interconnections between conductive pads which are characterized as being slack free.

It is a general object of the present invention to form two or more bends in a fine wire in the process of making a smoothly contoured fine wire interconnection.

It is another general object of the present invention to form fine gold wire interconnections with a minimum of gold wire.

It is yet another general object of the present invention to form fine wire interconnections in a minimum time with consistent wire loop shapes.

It is an object of the present invention to provide a method for making fine wire interconnections having the same loop height even though the distance between bonds varies.

It is yet another object of the present invention to provide a method for making fine wire interconnections which are not axially aligned or exactly opposite the first conductive pad.

It is yet another object of the present invention to provide a method for making fine wire interconnections which virtually eliminate the slack or dip in the wire at the second bond.

According to these and other objects of the present invention to be discussed in greater detail hereinafter, there is provided a programmable wire bonding machine which is programmed to make a conventional first bond on a first conductive pad and to raise the bonding tool a small distance about equal or slightly greater than the desired final loop height. The bonding tool is then moved rearwardly away from the second bond position so as to form two bends in the wire paid out of the capillary bonding tool before raising the bonding tool to the maximum height which pays out a length of wire greater than the amount desired in the interconnection. The bonding tool is moved downwardly and laterally in a first predetermined path which causes a portion of the wire to re-enter the bonding tool. When the length of wire outside the bonding tool reaches the desired length of the interconnection the bonding tool is moved in a second predetermined path which exerts tension on the wire outside the bonding tool and bends the wire under the face of the bonding tool to form a substantially horizontal wire under the working face of the bond tool thus producing a slack free interconnection wire which is immune to side thrust generated by engagement of the wire with a side of an outer lead.

BRIEF DESCRIPTION OF THE DRAWINGS

The foregoing objects and advantages of the novel method of making fine wire interconnections will be made apparent from the detailed description of the accompanying drawings in which:

FIG. 10, which comprises FIGS. 10A through 10F, is an enlarged pictorial representation in elevation of a fine wire being formed at the second bond position showing the successive deformation of the fine wires under the working face of the bonding tool prior to making the second bond.

DESCRIPTION OF THE PREFERRED EMBODIMENT

Figure 1:
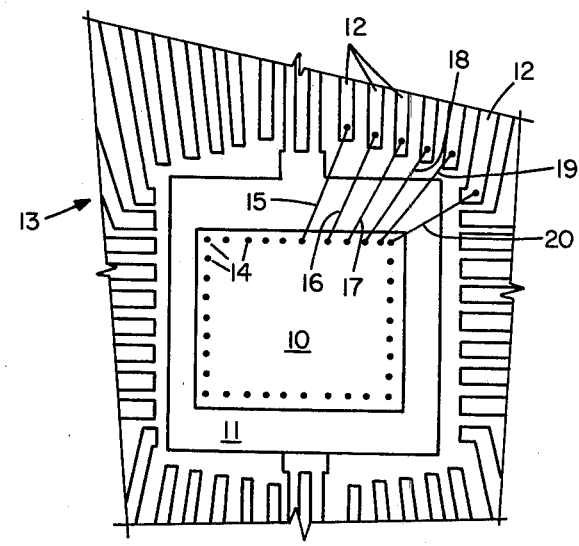
FIG. 1 is a plan view of an integrated circuit chip mounted on a substrate and showing fine wire connecting conductive pads on the chip to outer lead conductive pads.

Refer now to FIG. 1 which is a plan view of a typical high density integrated circuit chip 10 which is mounted on a substrate or ground plane 11 and is surrounded by a plurality of elongated fingers 12 which form conductive lead outs for the integrated circuit device 13. Chip 10 is provided with a plurality of first conductive pads 14 onto which a first bond is to be made by a wire bonding machine which forms the interconnection wires 15 through 20. It will be noted that the outer conductive pads or fingers 12 are arranged in a pattern or array in which the distance from the first bond position to the second bond position is not constant. The distance between the first bond and the second bond may vary from as little as 30 mils up to 200 mils. The interconnecting fine wire 15 is not axially aligned with its elongated finger 12, however, the interconnecting wire 15 crosses the front or end of the finger 12. The interconnection wire 19 and 20 cross over the side of the elongated fingers 12 and when the second bond is being made on the finger 12 the wire has a tendency to move sideways due to the force or thrust exerted by the side of the elongated finger. This thrust or force can cause the interconnecting wires 19 and 20 to have deviations from a straight line path. As will be explained in detail hereinafter, the present invention provides a method of forming the interconnection wires so that the side thrust or side forces exerted by the edges of the elongated fingers 12 is avoided even though the interconnecting wires 15 to 20 may cross over the side of a finger 12.

Figure 2:
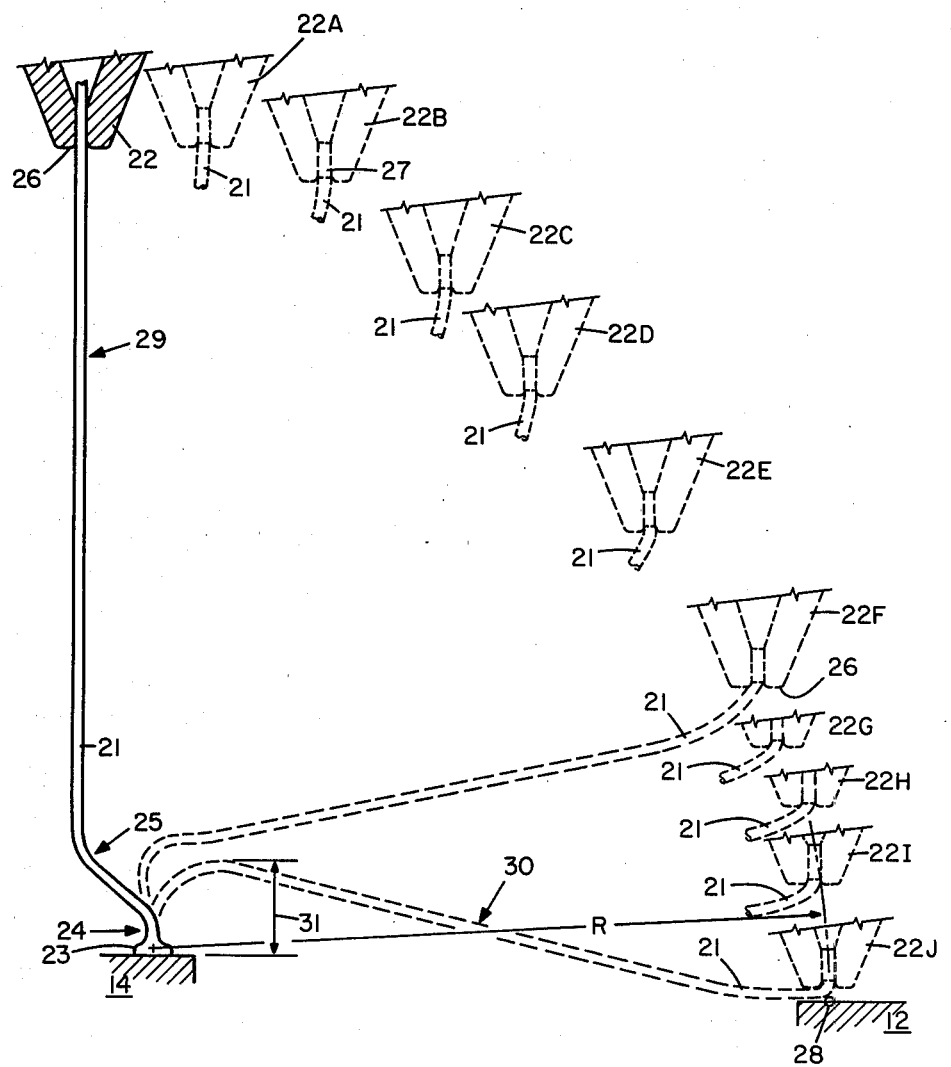
FIG. 2 is a pictorial representation in elevation of the path the capillary bonding tool takes in making a preferred fine wire interconnection.

Refer now to FIG. 2 which is a pictorial representation in elevation showing a preferred fine wire interconnection being formed. The interconnection wire 21 is shown ball bonded to the first conductive pad 14 and the capillary bonding tool 22 is shown raised to its maximum height or rise point. After making the first ball bond 23 on the first conductive pad 14 the capillary bonding tool 22 is raised vertically a small amount. This small distance is preferably six up to about 17 mils and then the bonding tool 22 is moved to the left which is a direction away from the elongated finger 12. This vertical rise and subsequent movement in the rear away from conductive pad 12 forms a bend 24 adjacent the bond 23 and forms a second bend 25 under the working face 26 of the bonding tool 22. The bonding tool 22 is preferably moved initially in a substantially horizontal direction to a position shown in phantom lines as bonding tool 22A. The fine wire 21 extending from capillary bonding tool 22A is shown acquiring only a slight skew or deviation from the vertical. This substantially horizontal movement is desired because it permits time to initiate ultrasonic vibration of the bonding tool 22 if such is desired. It will be understood that ultrasonic vibration of bonding tool 22 keeps the friction between fine wire 21 and the sides of the bonding tool 22 very low. When the bonding tool 22 has moved to the position shows as 22B the fine wire 21 is being bent in the throat of the bonding tool 22, however, since the friction between the throat 27 and the fine wire 21 is very low, the wire 21 re-enters the throat of the bonding tool 22. As bonding tool 22 moves through successive positions shown in phantom lines as 22C and 22D the fine wire 21 continues to re-enter the bonding tool 22. Stated differently, the bonding tool 22 is being moved in a predetermined path in which the distance from the first bond 23 to the working face 26 of the bonding tool 22 is decreasing. By the time the bonding tool 22 has reached the position shown in phantom lines as bonding tool 22E the fine wire 21 has begun to bend substantially at the working face of the bonding tool. By the time the bonding tool 22 has reached the position shown as 22F the fine wire 21 is substantially bent at the working face 26 of the bonding tool 22F and a capstan effect or locking effect has taken place. as the fine wire 21 is locked at the working face 26 of the bonding tool 22F the bonding tool 22 enters a second predetermined path in which the distance from the bonding tool 22 to the first bond 23 is increasing. This increase in the distance from the first bond 23 to the bonding tool 22 applies a tension in the wire 21 which causes the bends 24 and 25 to be reformed. The bonding tool position 22G, 22H, 22I and 22J form a arcuate path in which the bonding tool 22 is approaching an arcuate path described by a radius R whose distance is measured from the first bond 23 to the bonding input 28 where the second bond will be made on the second conductive pad or elongated finger 12. If a segment of a circle having a radius whose length is equal to the distance between the first bond 23 and the second bond 28 and having its focal point the first bond 23 it will be found that the bonding tool positions 22F through 22J are always inside of the segment of the circle. Accordingly, it will be understood that the bonding tool as it approaches its final bonding position 22J is converging on or moving asymptotic to the segment of the circle whose radius is the distance between the bonding points.

The length of wire 29 which is extending from the bonding tool 22 is slightly greater than the length of wire required for the final interconnection 30. The total length of wire in the interconnection 30 is approximately the distance between bonding points 23 and 28 plus the final height of the loop 31 above the first bond 23.

The main reason for raising the bonding tool 22 to a maximum height which pays out a length of wire 29 which is over twenty-five percent greater than the length of wire 30 requires for the final interconnection is to provide a factor of safety. The first predetermined path described by the position of the bonding tools 22A through 22E is not a critical path but enables the bonding tool to enter the critical path shown by the bonding tools 22F through 22J. As long as bonding tool 22 bends the fine wire 21 under the working face 26 to cause a locking effect when the length of wire extending from the bonding tool 22 is the desired length for making the final interconnection the bonding tool 22 could be moved through a number of different paths. If the bonding tool 22 is raised too high there is a distinct possibility that the wire 21 could bend or push back and it would be difficult to enter the correct second predetermined path shown by the bonding tools 22F through 22J.

When the bonding tool 22 is not raised high enough, the capstan or the locking effect on the wire 21 occurs too early at the end of the first predetermined path and the length of wire extending from the bonding tool 22 will be too short causing the loop height 31 to be lower or in some cases the wire can be stretched to the point where the first bond 23 is destroyed. Having explained the preferred operation to provide a margin of safety it will be understood that a first predetermined path in which the bonding tool 22 is moved from position 22A to position 22E can be described which will permit the length of wire 29 to remain substantially constant as the bonding tool reaches the point approximately shown at position 22F where the lock up or capstan effect occurs.

Figure 3:
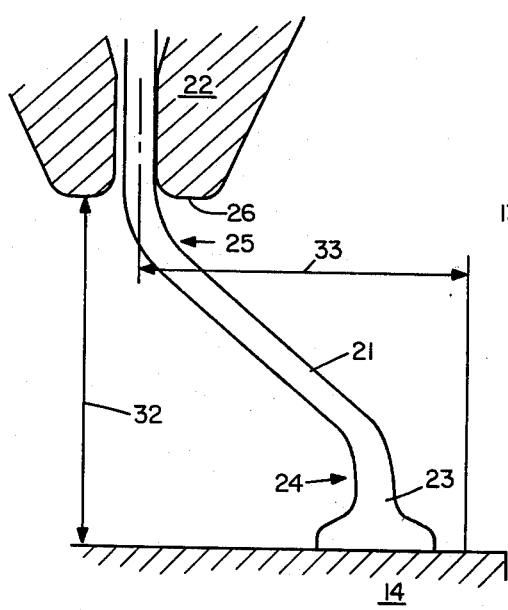
FIG. 3 is an enlarged pictorial representation in elevation of a fine wire at the first bond made on a first conductive pad.

Refer now to FIGS. 3 through 9 showing the small length of fine wire 21 which extends from the first bond 23. After the bond 23 is made on the first conductive pad 14 the bonding tool 22 is preferably raised substantially vertical a distance of approximately 15 mils when employing 1.3 mil gold wire. After the bonding tool has been raised to the vertical position shown by height 32 the bonding tool 22 may be moved horizontally a distance from 3 to 15 mils as shown by the distance 33 so that the lower bend 24 and the upper bend 25 take a permanent set when the wire 21 is stressed beyond its elastic limit. It is desirable that the slope of the wire 21 shown in FIG. 3 is not bent or diverted from the vertical axis more than 45 degrees which could incur damage to the wire.

Figure 4:
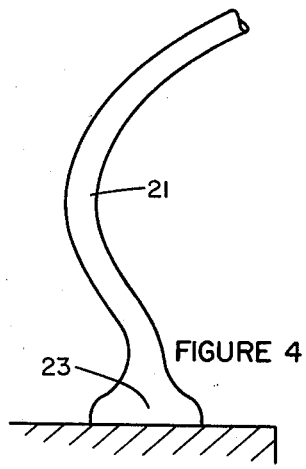
FIGS. 4 to 9 are enlarged pictorial representations in elevation of a fine wire at the first bond position showing the successive deformation of the fine wire which form the loop.
Figure 5:
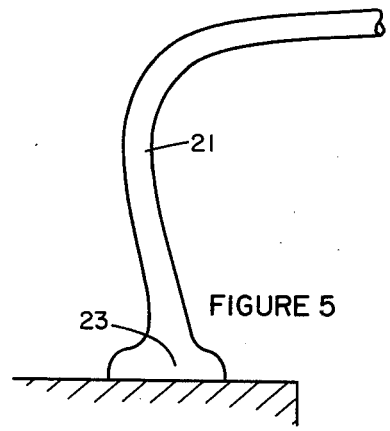
Figure 6:
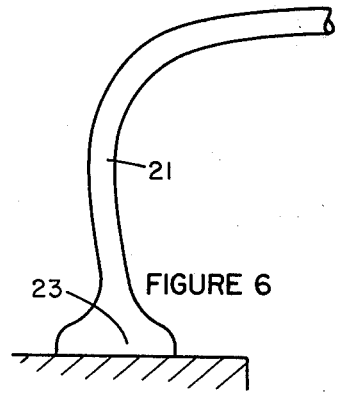
Figure 7:
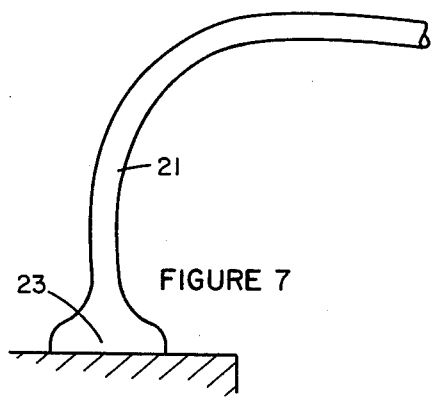
Figure 8:
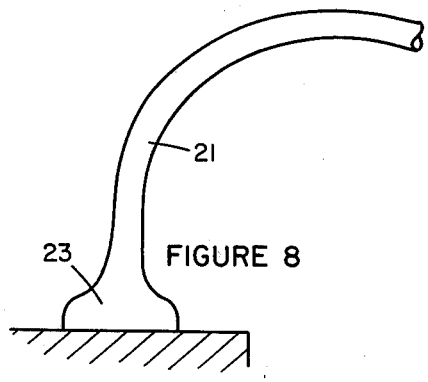
Figure 9:
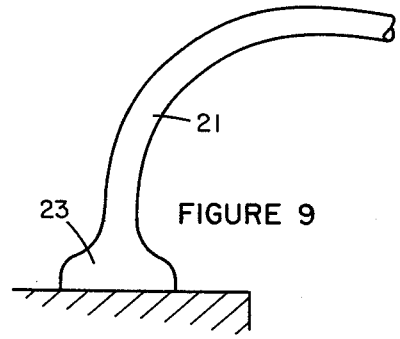

FIG. 4 shows the reformed shape of the initial small length of wire 21 after the bonding tool 22 has moved to the position 22C as shown in FIG. 2. Similarly, FIG. 5 shows the small length of wire as it would occur after the bonding tool has moved to the position 22E as shown in FIG. 2. FIG. 6 shows the small length of wire at the first bond 23 after the bonding tool 22 has moved to position 22G. FIG. 7 shows the small length of wire 21 after the bonding tool has moved to the position shown at 22H. FIG. 8 shows the small length of wire 21 after the bonding tool has moved to position 22I and FIG. 9 shows the small length of wire 21 after the bonding tool has moved to the position 22J shown in FIG. 2.

Refer now to FIG. 10 which comprises FIGS. 10A through 10F. FIG. 10 is designed to show in detail how the wire 21 is bent under the working face of the bonding tool to cause a locking effect so that the desired length of wire for the final connection is always assured. The bonding tool positions are numbered 22D through 22J as shown in FIG. 2. It will be noted that the wire 21 somewhere between the positions 22D and 22G is definitely bent under the working face 26 of the bonding tool 22G so as to cause a capstan or locking effect. The exact point at which the locking effect takes place depends on the aforementioned first predetermined path. It is entirely possible that a path could be designed which would enable the bonding tool 22 to initially lock at the position approximating 22A and still enter into the desired second predetermined path in which the arcuate movement of the bonding tool moves in a arcuate path so as to move away from the first bond 23 and maintain the fine wire 21 in tension as it is being bonded to the second bond position 28. For purposes of this description the second predetermined path starts when the bonding tool 22 has effectively stopped relative movement with the wire 21.

Figure 11:
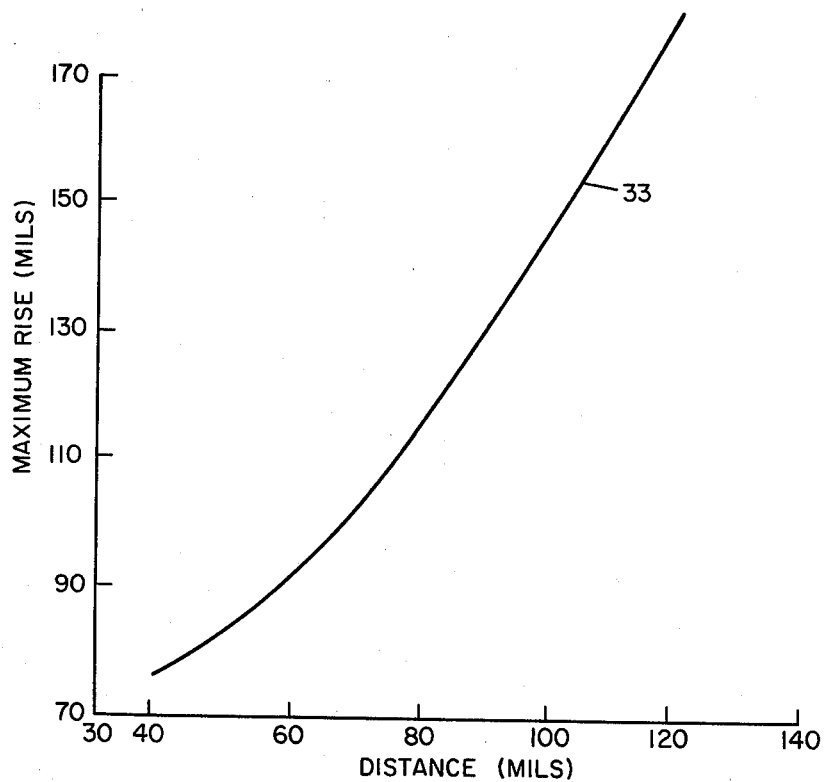
FIG. 11 is a chart showing the maximum rise of the bonding tool after making a first bond versus the distance between first and second bond for a particular diameter of gold wire.

FIG. 11 is a curve 33 showing the desired maximum rise of the bonding tool 22 above the first bond 23 versus the distance between bonding points 23 and 28 in mils. The curve shown was discovered to give optimum results when using 1.0 to 1.3 mil diameter gold wire.

It will be understood that the curve 33 has been proven to enable the bonding tool 22 to enter into the aforementioned second predetermined path and may change slightly when the wire sizes or wire hardnesses are changed. For example, it would be expected that hard aluminum wire would have a different friction coefficient with the throat 27 of the bonding tool 22 which would enable the modification of the maximum height, but would not change the desired arcuate path as the bonding tool approaches the second bond 28. A typical range of examples for larger wires would be a height of 150 mils when the pads are 40 mils apart, up to 220 mils height when the pads are 100 mils apart.

Having explained a preferred embodiment of the method employed to obtain consistent slack free wire interconnections when the distance between bonding points exceeds 80 mils, it will also be understood that the fine wire 21 under the face of the bonding tool is substantially in a horizontal plane. Having the wire 21 basically flat and parallel to the second conductive pad 12 eliminates any side thrust or force which could cause the interconnection wire 30 to stray from a straight path between bonds. By maintaining a tension force in the wire 21 during the traversal of the second predetermined arcuate path, sagging wires and bent wires are vitually eliminated.

Employing the methods of the present invention, the small preformed bends in the wire 21 assure a constant loop height. By controlling the maximum use of the bonding tool after a first bond, excessive pay out of wire 21 is eliminated and shooting wires which results from excessive pay outs are eliminated.

As explained hereinbefore the method preferred can be modified and under special conditions would provide consistent bonds. For example, when the distance between bonds stays substantially constant, the bonding tool could be raised to an exact height which gives the desired length of wire for the interconnection. When such attempts are made, additional clamping means are required to hold the wire 21 relative to the bonding tool 22. The present invention method has a built-in factor of safety which does not require such clamping means because the bonding tool locks the wire at a point when the bend in the wire 21 is acting as a spring to maintain tension while the locking takes place. Accordingly, it will be understood that the locking effect takes place not at a precise point but during traversal of a desired predetermined path.

We claim:

1. A method of making slack free fine wire interconnections between a first and a second conductive pad comprising the step of:
    bonding an end of said fine wire to said first conductive pad employing a capillary bonding tool,
    raising said bonding tool vertically upward and horizontally backwards relative to said fine wire to provide two small formed bends in said fine wire,
    raising said bonding tool vertically to pay out a total length of said fine wire slightly greater than the amount required for the final wire interconnection,
    moving said bonding tool horizontally and vertically downward toward said second conductive pad in a first predetermined path which causes a small portion of said wire to re-enter said bonding tool,
    bending said fine wire at the working face of said bonding tool, leaving a length of wire outside of said bonding tool equal to said final wire length of the interconnection,
    moving said bonding tool horizontally and vertically downward toward said second conductive pad in a second predetermined path which creates tension in said fine wire as said bonding tool approaches and touches said fine wire against said second conductive pad, and
    bonding said fine wire under said bonding tool to said second conductive pad to form a slack free interconnection.

2. A method of making slack free fine wire interconnections as set forth in claim 1 wherein said step of raising said bonding tool vertically upward and horizontally backwards to form two small bends comprises raising the bonding tool vertically upward a small amount and subsequently moving substantially horizontally backwards away from said second conductive pad thereby forming a first bend adjacent the bond on the first conductive pad and a second bend adjacent the working face of said bonding tool.

3. A method of making slack free fine wire interconnections as set forth in claim 1 wherein said step of moving said bonding tool horizontally and vertically downward toward said second conductive pad comprises the step of initially moving said bonding tool substantially horizontally and subsequently moving said bonding tool in a path which moves the bonding tool closer to said first conductive pad and closer to said second conductive pad causing a small portion of said fine wire to re-enter said bonding tool.

4. A method of making slack free fine wire interconnections as set forth in claim 3 which further includes the step of ultrasonically vibrating said bonding tool as it moves closer to said conductive pads.

5. A method of making slack free fine wire interconnections as set forth in claim 1 which further includes the step of ultrasonically vibrating said bonding tool after raising said bonding tool vertically to pay out a total length of fine wire slightly greater than the amount required for the final wire interconnection.

6. A method of making slack free fine wire interconnections as set forth in claim 5 wherein said step of ultrasonically vibrating said bonding tool after raising said bonding tool vertically is continued for at least as long as said fine wire is re-entering said bonding tool.

7. A method of making slack free fine wire interconnections as set forth in claim 6 where the amount of fine wire permitted to re-enter said bonding tool is so limited that it does not take a permanent deformation upon re-entering said bonding tool.

8. A method of making slack free fine wire interconnections as set forth in claim 2 wherein the step of raising said bonding tool vertically upward a small amount comprises raising said bonding tool less than seventeen one thousandths of an inch before moving said bonding tool horizontally backwards away from said second conductive pad.

9. A method of making slack free fine wire interconnections as set forth in claim 2 wherein the step of raising said bonding tool comprising raising said bonding tool from six to seventeen one thousandths of an inch when the distance between said conductive pads is up to two tenths of an inch.

10. A method of making slack free fine wire interconnections as set forth in claim 2 wherein the step of moving said bonding tool substantially horizontally backwards away from said second conductive pad comprises moving said bonding tool laterally up to seventeen one thousandths of an inch to bend said fine wire beyond its elastic limit and to form said two small bends.

11. A method of making slack free fine wire interconnections as set forth in claim 1 wherein said step of raising said bonding tool vertically to pay out a total length of said fine wire slightly greater than the amount required for the final wire interconnection comprises raising said bonding tool to an optimum predetermined height.

12. A method of making slack free fine wire interconnections as set forth in claim 11 wherein said optimum predetermined height increases exponentially as the distance between pads increases from a minimum of about 150 mils when the the distance between conductive pads is about 40 mils.

13. A method of making slack free fine wire interconnections as set forth in claim 11 wherein said optimum predetermined height is about 220 mils when the distance between conductive pads is about 100 mils.

14. A method of making slack free fine wire interconnections as set forth in claim 2 wherein said step of moving said bonding tool horizontally and vertically downwardly toward said second conductive pad in a second predetermined path comprises moving said bonding tool in a plurality of arcuate paths, each said arcuate path having its radial center at said first bend on said fine wire.

15. A method of making slack free fine wire interconnections as set forth in claim 14 wherein said second bend is being moved toward said second conductive pad when said bonding tool is moving in said second predetermined path.

16. A method of making slack free fine wire interconnections as set forth in claim 1 wherein said second predetermined path comprises an arcuate path whose distance to the first bond on the first conductive pad never exceeds the arc of a circle drawn with a radius equal to the distance between bonds on said conductive pads and having its center at said first bond.

17. A method of making slack free fine wire interconnections as set forth in claim 16 wherein the step of moving said bonding tool in a second predetermined path comprises an arcuate path in which the distance from said bonding tool to said first bond increases as said bonding tool approaches said second conductive pad.

18. A method of making slack free fine wire interconnections as set forth in claim 17 wherein the termination of said arcuate path at said second conductive pad is substantially vertical.

19. A method of making slack free gold wire interconnections between a first and a second conductive pad comprising the steps of:
bonding a gold ball on a gold wire to said first conductive pad employing a capillary bonding tool,
raising said bonding tool substantially vertically from said gold ball to pay out a small portion of gold wire from said capillary,
moving said bonding tool substantially horizontally in a direction away from said second conductive pad to
form a first bend in said gold wire adjacent said gold ball and
to form a second bend in said gold wire adjacent the working face of said bonding tool,
raising said bonding tool substantially vertically from said second bend to pay out a total length of gold wire greater than the amount of gold wire required for the final wire interconnection,
moving said bonding tool substantially horizontally a small amount without causing movement of said gold wire into or out of said bonding tool,
moving said bonding tool horizontally and vertically toward said second conductive pad in a predetermined path which causes a small portion of said gold wire to re-enter said bonding tool,
moving said bonding tool toward said second conductive pad in an arcuate path which converges into the arc of a circle whose radius in equal to the distance between said first and said second conductive pads,
bonding said gold wire under the face of said bonding tool to said second conductive pad,
raising said bonding tool a small distance,
breaking said wire at the bond on said second conductive pad leaving a tail equal in length to said small distance, and
forming a gold ball on said gold wire tail by heating said tail above the melting temperature of gold.

20. A method of making slack free gold wire bonds as set forth in claim 19 wherein the step of moving said bonding tool toward said second conductive pad in an arcuate path further includes the step of bending said gold wire at the working face of said bonding tool and maintaining the paid out gold wire in tension between said bonding tool and said second bend in said gold wire.

21. A method of making slack free gold wire bonds as set forth in claim 20 wherein said step of moving said bonding tool toward said second conductive pad in an arcuate path further includes bending said gold wire about a floating pivot point located near said gold ball.

22. A method of making slack free gold wire bonds as set forth in claim 21 wherein said portion of gold wire on either side of said second bend forms an arcuate bend whose radius is approximately equal to the loop height of the wire interconnection.

23. A method of making a slack free loop in a fine wire interconnection between a first and a second conductive pad of a semiconductor device comprising the steps of:
bonding said fine wire to said first conductive pad with a capillary bonding tool,
raising said bonding tool vertically and moving said bonding tool horizontally away from said second conductive pad to provide a first and a second offset bend in said fine wire,
continuing to raise said bonding tool vertically to pay out a length of fine wire at least twenty-five percent greater than the amount required for said interconnection,
moving said bonding tool substantially horizontally toward said second conductive pad to initiate bending of said fine wire near said first conductive pad,
moving said bonding tool horizontally and vertically toward said second conductive pad in a first predetermined path which pushes a portion of said fine wire back into said capillary bonding tool,
continuing to move said bonding tool horizontally and vertically toward said second conductive pad in a second predetermined path in which said fine wire is bent at the working face of said capillary bonding tool and said offset bend nearest the first conductive pad is continuously reformed and bent toward said second conductive pad, and
bonding said fine wire to said second conductive pad while maintaining tension in said fine wire interconnection.

24. A method of making a slack free loop in a fine wire as set forth in claim 23 wherein said step of continuing to move said bonding tool horizontally and vertically toward said second conductive pad is characterized by the continuous movement of said bonding tool away from said first conductive pad while maintaining tension in said fine wire.

* * * * *